(12) United States Patent
Fukasawa

(10) Patent No.: US 7,185,303 B2
(45) Date of Patent: Feb. 27, 2007

(54) METHOD AND APPARATUS FOR LAYING OUT CELLS IN A SEMICONDUCTOR DEVICE

(75) Inventor: Shinji Fukasawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 99 days.

(21) Appl. No.: 11/156,668

(22) Filed: Jun. 21, 2005

(65) Prior Publication Data
US 2006/0225016 A1 Oct. 5, 2006

(30) Foreign Application Priority Data
Mar. 30, 2005 (JP) ............................. 2005-099939

(51) Int. Cl.
G06F 17/50 (2006.01)

(52) U.S. Cl. ........................................... 716/8
(58) Field of Classification Search ............... 716/8
See application file for complete search history.

(56) References Cited

U.S. PATENT DOCUMENTS

| | | | | |
|---|---|---|---|---|
| 5,844,811 A | * | 12/1998 | Scepanovic et al. | 716/10 |
| 5,914,888 A | * | 6/1999 | Scepanovic et al. | 716/8 |
| 6,671,865 B1 | * | 12/2003 | Ali et al. | 716/8 |
| 6,954,919 B2 | * | 10/2005 | Ozaki et al. | 716/11 |
| 2003/0135835 A1 | * | 7/2003 | Komaki | 716/10 |
| 2003/0163795 A1 | * | 8/2003 | Morgan et al. | 716/10 |
| 2004/0006754 A1 | * | 1/2004 | Sonohara | 716/8 |
| 2004/0117751 A1 | * | 6/2004 | Shrowty et al. | 716/12 |

FOREIGN PATENT DOCUMENTS

JP 2004-013205 1/2004

* cited by examiner

*Primary Examiner*—Stacy A Whitmore
(74) *Attorney, Agent, or Firm*—Staas & Halsey LLP

(57) ABSTRACT

A method for generating layout data for macro cells in a core region of a semiconductor device. The method includes generating wiring margin-added macro cells, calculating the area of a maximum standard cell region by excluding the area of the wiring margin-added macro cells from the area of the core region, calculating the area of an actual standard cell region in which layout of standard cells is enabled in the core region in accordance with a floor plan laying out the wiring margin-added macro cells, calculating a dead space percentage of the floor plan from the area of the maximum standard cell region and the area of the actual standard cell region, and correcting the floor plan by moving at least one wiring margin-added macro cells so that the dead space percentage becomes less than a reference value.

20 Claims, 4 Drawing Sheets

METHOD AND APPARATUS FOR LAYING OUT CELLS IN A SEMICONDUCTOR DEVICE

CROSS-REFERENCE TO RELATED APPLICATIONS

This application is based upon and claims the benefit of priority from prior Japanese Patent Application No. 2005-099939, filed on Mar. 30, 2005, the entire contents of which are incorporated herein by reference.

BACKGROUND OF THE INVENTION

The present invention relates to the development of semiconductor devices, and more particularly, to a method and apparatus for generating with a computer the layout of cells included in a semiconductor device.

Due to the enlargement of recent semiconductor devices (LSIs), the time for designing the semiconductor devices has become longer. To shorten the design time, the number of design processes that are redone must be reduced. Thus, the designing of a floor plan for an LSI must be optimized.

In the prior art, an LSI is designed by generating a floor plan from a netlist obtained through logic synthesizing. Cells are laid out and wires are routed according to the floor plan to generate a chip layout. Then, a circuit simulation is conducted on the chip layout. The circuit simulation verifies whether the LSI of the chip layout will function at a level that would ensure the reliability of signals and power supplies.

A typical LSI includes a plurality of standard cells and a plurality of macro cells. The generation of the LSI floor plan (layout data) includes a determination of the layout and the macro cells and standard cells. The relative positions of the macro cells and the orientation of each macro cell is determined by taking into consideration factors such as routability and timing closure (refer to Japanese Laid-Open Patent Publication No. 2004-13205). Standard cells are laid out in standard cell regions, which differ from the regions in which the macro cells are laid out.

The chip size of an LSI is determined irrelevant to the size of the macro cells. Thus, when laying out a plurality of macro cells, empty regions (overly narrow regions) may be formed between macro cells. The layout of a standard cell in an overly narrow region would produce a detour net that detours signal nets. This would affect the routability and timing closure in an undesirable manner. Therefore, when designing and LSI in the prior art, the overly narrow region is set as a dead space in which the layout of standard cells is prohibited.

SUMMARY OF THE INVENTION

The setting of the dead space decreases the regions in which standard cells may be laid out. A decrease in the standard cell region may disable the layout of a certain number of standard cells or result in insufficient space (wiring regions) for wiring that connects the macro cells and the standard cells. This may produce a disconnected net. Further, signal net detour may occur depending on the layout of standard cells and cause deficient timings. In this case, the process for laying out macro cells must be redone to lay out the macro cells and wiring and verify timings again. This would require a long period of time and ultimately lengthen the design time.

Accordingly, in the prior art, the setting of dead space, which restricts the layout of standard cells, may affect the routability and timing closure in an undesirable manner.

One aspect of the present invention is a method for generating layout data with a computer to lay out a plurality of macro cells in a core region of a semiconductor device. The method includes determining auxiliary layout regions corresponding to the macro cells, storing information of the auxiliary layout regions in a memory, calculating the area of a maximum standard cell region by subtracting the area of the macro cells and the area of the auxiliary layout regions from the area of the core region, storing the area of the maximum standard cell region in the memory, calculating the area of an actual standard cell region in which layout of standard cells is enabled in the core region in accordance with a floor plan result in which the macro cells are laid out, storing the area of the standard cell region in the memory, reading the area of the maximum standard cell region and the area of the actual standard cell region from the memory, calculating a dead space percentage of the floor plan from the area of the maximum standard cell region and the area of the actual standard cell region, comparing the dead space percentage with a reference value, and changing the layout of the macro cells corresponding to the floor plan based on the result of said comparing with the computer so that the dead space percentage becomes less than or equal to the reference value.

A further aspect of the present invention is an apparatus for generating layout data to lay out a plurality of macro cells in a core region of a semiconductor device. The apparatus includes a memory. An auxiliary layout region calculation circuit determines auxiliary layout regions corresponding to the macro cells, and stores information of the auxiliary layout regions in the memory. A maximum standard cell calculation circuit calculates the area of a maximum standard cell region by subtracting the area of the macro cells and the area of the auxiliary layout regions from the area of the core region, and stores the area of the maximum standard cell region in the memory. An actual standard cell calculation circuit calculates the area of an actual standard cell region in which layout of standard cells is enabled in the core region in accordance with a floor plan result in which the macro cells are laid out, and stores the area of the standard cell region in the memory. A dead space calculation circuit reads the area of the maximum standard cell region and the area of the actual standard cell region from the memory to calculate a dead space percentage of the floor plan from the area of the maximum standard cell region and the area of the actual standard cell region. A dead space determination circuit compares the dead space percentage with a reference value to determine whether or not the layout of the macro cells must be changed. A floor plan generation circuit generates a floor plan based on the determination result of the dead space determination circuit by changing the layout of the macro cells so that the dead space percentage becomes less than or equal to the reference value.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 2:
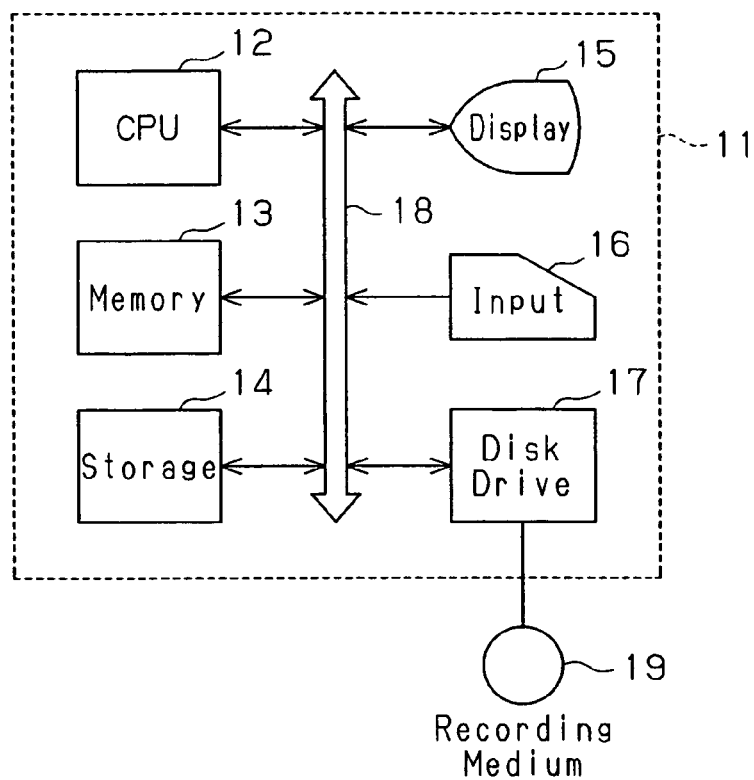
FIG. 2 is a block diagram of a computer system that executes the method of FIG. 1.

A preferred embodiment of the present invention will now be discussed with reference to the drawings. Referring to FIG. 2, a typical computer-aided design (CAD) apparatus is employed as a computer system 11, which executes the layout method of the present invention. The computer system 11 includes a central processing unit (CPU) 12, a memory 13, a storage device 14, a display 15, an input device 16, and a drive device 17.

The CPU 12 uses the memory 13 to execute a layout program and generate layout data. The memory 13 stores program data used to perform various processes. The memory 13 may be a cache memory, a system memory, or a display memory.

The display 15 displays layout (floor plan) images generated by the CPU 12 and a parameter input page. The display may be a cathode-ray tube (CRT), a liquid-crystal display (LCD), or a plasma display panel (PDP). The input device 16 is used to input user requests, commands, and parameters. The input device 16 may be a keyboard and a mouse (not shown).

The storage device 14 may be a magnetic disk device, an optical disc device, or a magneto-optic disc device. The storage device 14 stores electronic files 41 to 47 (FIG. 1) in addition to program data for designing the layout of a semiconductor device. In response to a command from the input device 16, the CPU 12 transfers the program data to the memory 13 to execute the process of FIG. 1.

The program data may be provided from a recording medium 19. The drive device 17 drives the recording medium 19. The CPU 12 drives the drive device 17 to read the program data from the recording medium 19 and install the program data in the storage device 14.

The recording medium 19 may be any type of computer-readable recording medium, such as a magnetic tape (MT), a memory card, a flexible disk, an optical disc (e.g., CD-ROM, DVD-ROM, . . . ), or a magneto-optical disc (MO, MD, . . . ). The program data stored in the recording medium 19 may be loaded to and used by the memory 13 when necessary.

The recording medium 19 includes a disk device and a recording medium, which records program data uploaded or downloaded by a communication medium. Further, in addition to a recording medium that records programs directly executed by a computer, the recording medium 19 may be a recording medium that records programs installed in other recording media (e.g., a hard disk) before being executed. Alternatively, the recording medium 19 may be a recording medium that records coded or compressed programs.

The method for laying out cells in a semiconductor device will now be discussed.

Figure 1:
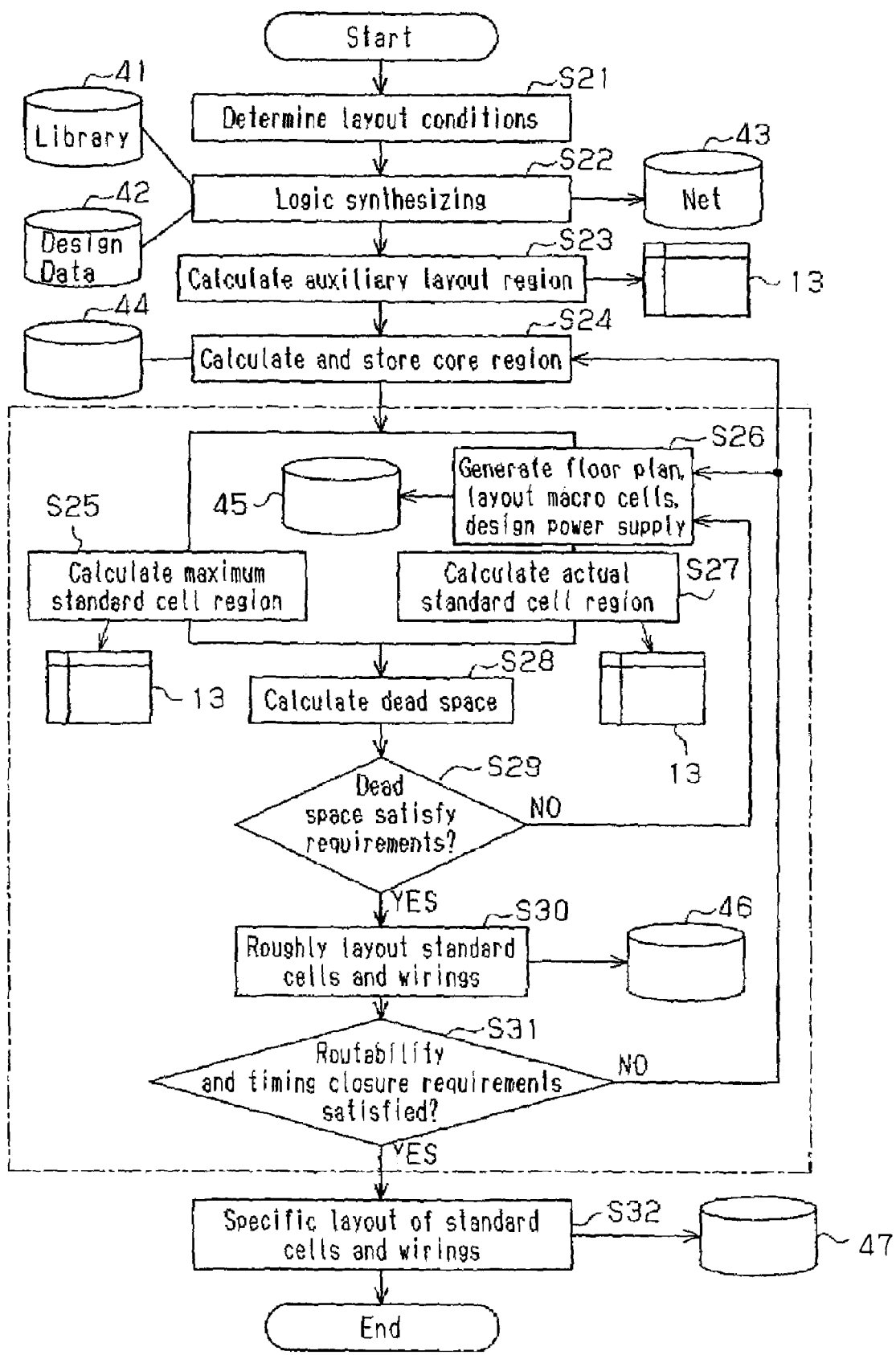
FIG. 1 is a flowchart showing a method for laying out cells according to a preferred embodiment of the present invention.

FIG. 1 is a schematic flowchart showing the method for laying out cells in a semiconductor device in the preferred embodiment. The CPU 12 of FIG. 2 executes the layout method in accordance with steps S21 to S32 illustrated in FIG. 1 to generate LSI layout data. The CPU 12, which performs steps S21 to S32, functions as an auxiliary layout region calculation circuit, a maximum standard cell region calculation circuit, an actual standard region calculation circuit, a dead space calculation circuit, a dead space determination circuit, and a floor plan generation circuit.

In step S21, the CPU 12 first determines the layout conditions, such as the wire width technology or the number of wiring layers, based on LSI specification data obtained from the input device 16 or an electronic file (not shown). The specification data includes timing conditions and length restrictions for wires transmitting predetermined signals.

In step S22, the CPU 12 performs logic synthesizing in accordance with the layout conditions determined in step S21, a cell library 41, and a design data 42 to generate a netlist 43. The cell library 41 is a database including information of macro cells and standard cells. The information of the macro cells and standard cells includes size, configuration, terminal location, and electrical property. The design data 42, for example, includes data for the operation of a circuit in hardware description language. The netlist 43 includes the macro cells and standard cells (names) configuring a circuit and net information for connecting the macro cells and standard cells.

The cell library 41, the design data 42, the netlist 43, and electronic files (described later) are generated by, for example, the storage device 14 of FIG. 2.

Figure 3:
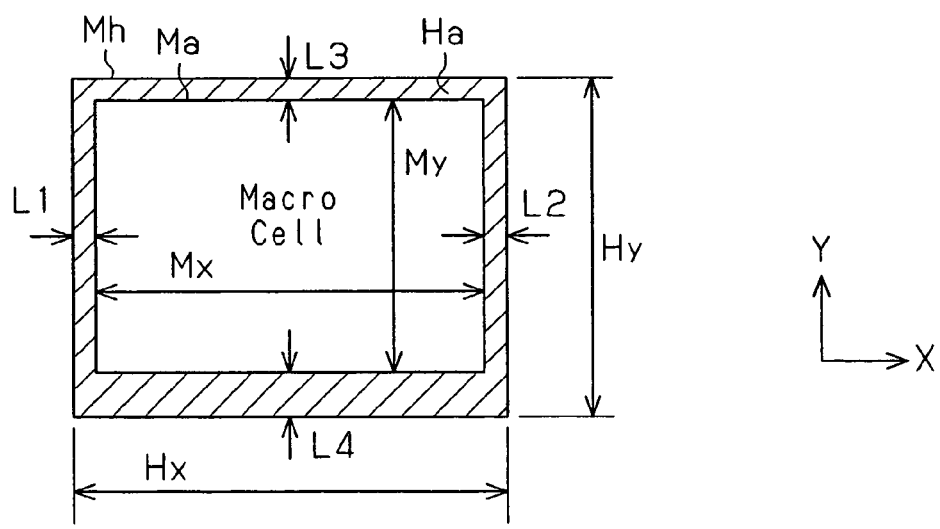
FIG. 3 is a schematic diagram showing a macro cell.

In step S23, the CPU 12 adds a supplemental region or an auxiliary layout region Ha to each macro cell Ma to generate a larger layout region Mh (FIG. 3). The layout region Mh may be referred to as a wiring margin-added macro cell in the specification. Referring to FIG. 3, the auxiliary layout region Ha surrounds a macro cell Ma. The auxiliary layout region Ha includes left and right portions, which are adjacent to the left and right sides of a macro cell Ma, and upper and lower portions, which are adjacent to the upper and lower sides of the macro cell Ma, as viewed in FIG. 3. The widths of the left and right portions measured in the x direction are L1 and L2, respectively. The widths of the upper and lower portions measured in the y direction are L3 and L4, respectively. Each width L1–L4 is constant. Each width L1, L2, L3, and L4 is determined in accordance with the type of macro cells incorporated in an LSI, predetermined for each macro cell, or the same in every macro cell. For example, the CPU 12 determines each of the widths L1 to L4 in accordance with the distance between adjacent macro cells and standard cells or in accordance with a resource (wiring channel) of a power supply wire and signal wires wired around or connected to the macro cell Ma. The CPU 12 stores a layout region Mh (information of the widths L1 to L4 and dimensions of the layout region Mh (Hx, Hy)) in the memory 13. When the dimensions of the macro cell Ma are represented by Mx and My, the dimensions Hx and Hy of the layout region Mh is expressed as described below.

$$Hx = Mx + L1 + L2$$

$$Hy = My + L3 + L4$$

The values representing the layout region Mh (including Hx and Hy) may differ in accordance with the type of the macro cell, differ between every macro cell, or be the same in every macro cell. The auxiliary layout region Ha may be added to only one of two opposing sides of the macro cell Ma. In this case, the width Lk of the portion adjacent to the right side or left side would be expressed by L1+L2, and the width Ly of the portion adjacent to the upper side or the lower side would be expressed by L3+L4.

In step S24, the CPU 12 calculates the size of a core region (layout region for standard cell) and determines the chip dimensions (Lcorex and Lcorey). The CPU 12 calculates the size of the core region using the method for estimating core size that is described in Japanese Patent Application No. 2003-303495. Then, the CPU 12 saves the calculated core region size (area) in the electronic file 44.

In step S25, the CPU 12 calculates a maximum standard cell region. The maximum standard cell region is an area obtained by subtracting the area of the layout region from the area of the core region, which is saved in the electronic file 44. More specifically, the maximum standard cell region is calculated from the next equation that uses the chip size (Lcorex and Lcorey) and the size of the layout region Mh for each macro cell (Hx and Hy).

maximum standard cell region=$Lcorex \times Lcorey - \Sigma (Hx \times Hy)$

=$Lcorex \times Lcorey - \Sigma ((Mx+L1+L2) \times (My+L3+L4))$

The CPU 12 stores the calculated maximum standard cell region in the memory 13.

In step S26, the CPU 12 generates a floor plan of the core region having the size calculated in step S24. The generated floor plan includes the layout of the macro cells and the layout of the power supply wires. The CPU 12 determines the layout of the macro cells so as to satisfy the routability requirements, which are related to the signal wiring congestion, and the timing closure requirements, which are related to timing conditions. Then, the CPU 12 lays out macro cells in accordance with the length of wiring that transmits predetermined signals and the timing conditions of the signals. For example, the CPU 12 lays out macro cells connected by the same wiring near each other to prevent the density of signal wiring from becoming excessively high. Further, the CPU 12 sets the overly narrow region between macro cells as dead space in which automatic layout of standard cells is prohibited. The CPU 12 saves the LSI layout data that is generated in this manner in the electronic file 45.

In step S27, the CPU 12 reads from the electronic file 45 the layout positions of the macro cells and layout prohibition regions determined in step S26 to calculate the area in which the layout of standard cells is enabled (actual standard cell region). Then, the CPU 12 stores the calculation result in the memory 13.

Step S25 is shown parallel to steps S26 and S27 in the flowchart. The CPU 12 carries out multi-thread procedures or has a multi-thread configuration and performs steps S26 and S27 parallel to step S25. The order of steps S25 to S27 may be changed. For example, step S26 may be performed before step S25.

In step S28, the CPU 12 reads from the memory 13 the maximum standard cell region calculated in step S25 and the area of the actual standard cell region calculated in step S27 to calculate a dead space area Sd0 and a dead space percentage Rd0. The dead space area Sd0 and the dead space percentage Rd0 are calculated from the next equation.

$Sd0 = Smax - Sf$ $Rd0 = Sd0/Smax$

In the above equations, Smax represents the area of the maximum standard cell region, and Sf represents the area of the standard cell region in a layout in which the macro cells are laid out.

In step S29, the CPU 12 determines whether the dead space percentage calculated in step S28 is less than a reference value Rth. The reference value Rth is obtained from past wiring layout results or simulations and is a value enabling the layout and wiring of standard cells. The CPU 12 compares the dead space percentage Rd0 and the reference value Rth. When the dead space percentage Rd0 exceeds the reference value Rth, the CPU 12 returns to step S26 to correct the floor plan and generate a corrected floor plan (corrected layout data). In accordance with the corrected floor plan, the CPU 12 changes the positions and orientations of macro cells, that is, moves macro cells. The CPU 12 repeats step S26 to S29 until the dead space percentage Rd0 becomes less than or equal to the reference value Rth to change the positions and orientations of macro cells so that the dead space percentage Rd0 does not exceed the reference value Rth. When the dead space percentage Rd0 becomes less than or equal to the reference value Rth, the CPU 12 proceeds to step S30.

In the processing loop of steps S26 to S29, the CPU 12 gives significance to area when laying out macro cells. However, the CPU 12 does not verify the standard cell layout, the signal wiring layout, and timings. Thus, the load on the CPU 12 is low. This enables the CPU 12 to perform the processing loop a number of times within a short period. The CPU 12 changes the layout of the power supply wiring when changing the positions and orientations of the macro cells.

In step S30, the CPU 12 roughly lays out standard cells in the standard cell regions, lays out wiring connecting macro cells and standard cells, and saves layout data corresponding to the layout in the electronic file 46. The processing of the layout and wiring in step S30 is performed more roughly in comparison with the processing of the layout and wiring in step S32. The CPU 12 roughly lays out standard cells by, for example, grouping a plurality of standard cells into a single block (cell group). In other words, the CPU 12 lays out a plurality of blocks. The number of blocks is less than the number of standard cells. Thus, the time required for laying out standard cell blocks is shorter than the time required for laying out standard cells. Accordingly, the layout of standard cells in units of blocks is simple.

In step S31, the CPU 12 determines whether the layout data saved in the electronic file 46 satisfies the routability and timing closure requirements. The CPU 12 proceeds to step S32 when the requirements are satisfied (YES). When the requirements are not satisfied and correction of the layout data is necessary (NO), the CPU 12 returns to step S24 or S26 depending on what is necessary. More specifically, when correction is necessary, the CPU 12 returns from step S31 to step S26 and changes the macro cell layout in step S26. If this change still cannot satisfy the routability and timing closure requirements, the CPU 12 changes the size of the core region in step S24.

In step S32, the CPU 12 determines the specific layout of the standard cells and the specific layout of the wiring connecting the macro cells and the standard cells. For example, for each standard cell block roughly laid out in step S30, the CPU 12 exchanges standard cells to minimize the wiring length. Then, the CPU 12 determines the layout of standard cells taking into consideration routability and timing closure, and determines the layout of wiring paths connected to those standard cells and macro cells. The CPU 12 saves the layout data of the standard cells and macro cells of which layout has been determined in the electronic file 47.

Figure 5:
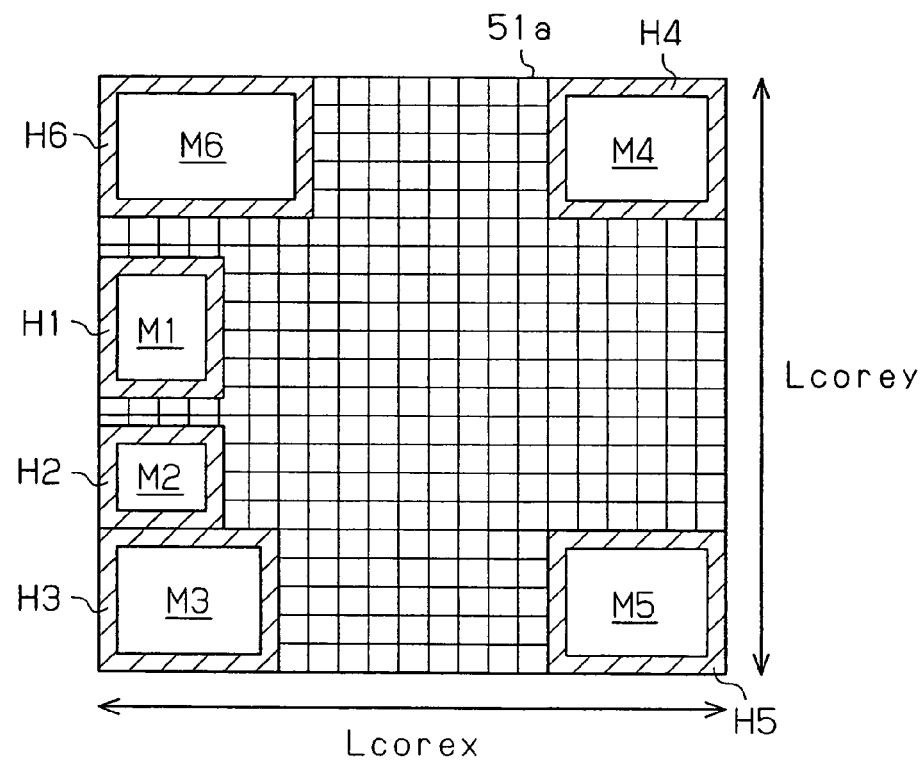
FIG. 5 is a schematic diagram showing the layout of a core region.
Figure 6:
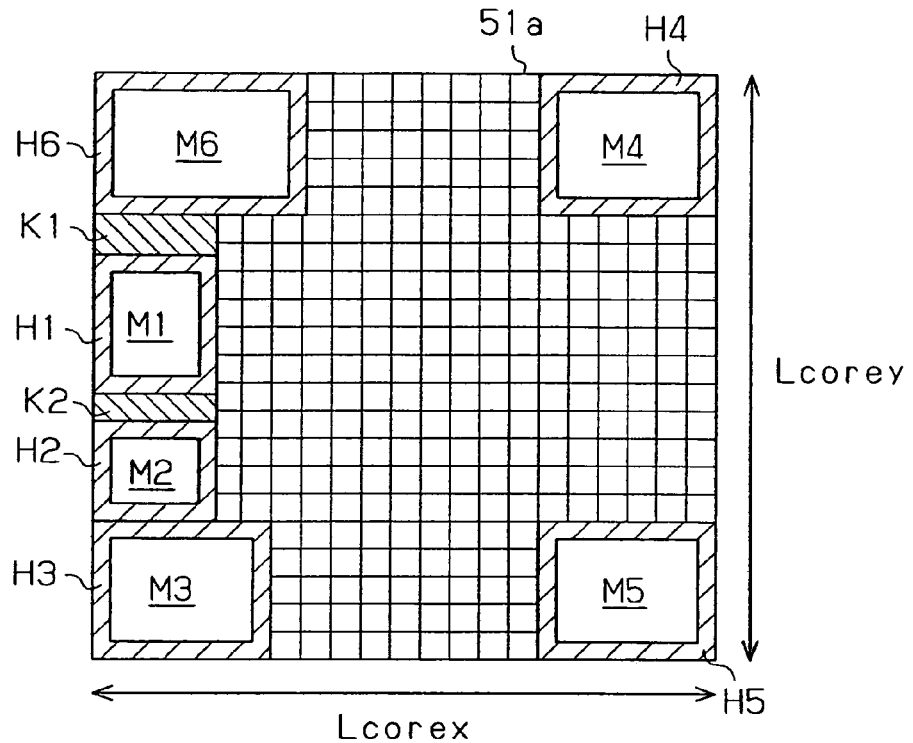
FIG. 6 is a schematic diagram showing the layout of a core region including dead space.

The operation of the preferred embodiment will now be described with reference to FIGS. 4 to 6.

Figure 4:
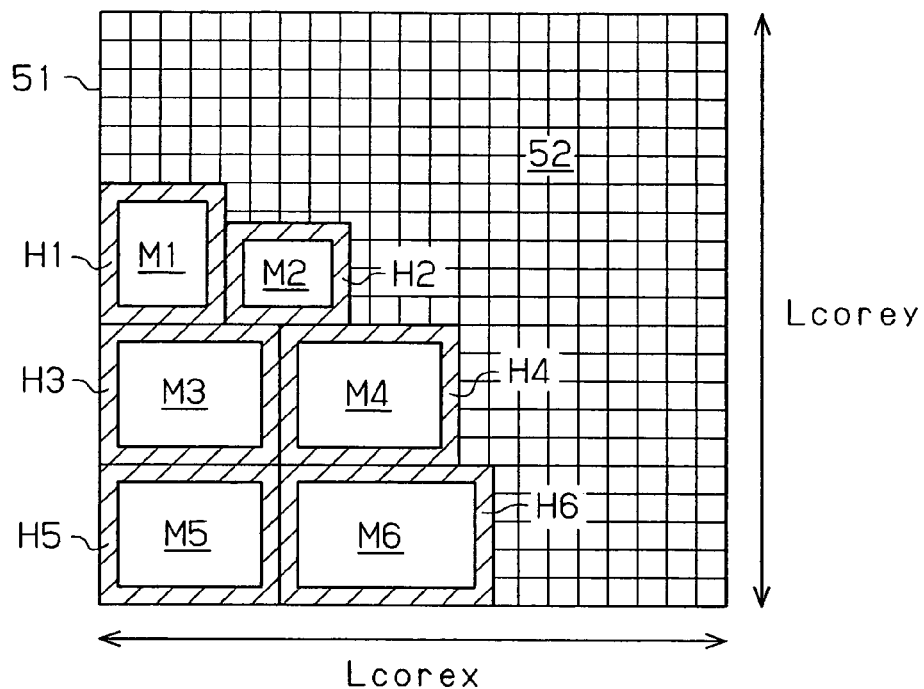
FIG. 4 is a schematic diagram showing an actual standard cell region.

The LSI shown in FIG. 4 includes six macro cells M1 to M6 and a plurality of standard cells (not shown). The CPU 12 lays out the macro cells M1 to M6 and the standard cells in the core region 51. In step S23, the CPU 12 adds auxiliary layout regions H1 to H6 to the macro cells M1 to M6, respectively. In step S24, the CPU 12 calculates the size of the core region 51 (Lcorex and Lcorey).

FIG. 4 shows the macro cells M1 to M6 and the auxiliary layout regions H1 to H6 lined up in the core region 51. In this state, the macro cells M1 to M6 and the auxiliary layout regions H1 to H6 are arranged so that there is no space between one another. In the core region 51, the region excluding the macro cells M1 to M6 and the auxiliary layout regions H1 to H6 is the maximum standard cell region 52. In step S25, the CPU 12 calculates the area of the maximum standard cell region 52.

In step S26, the CPU 12 generates a floor plan. FIG. 5 shows a core region 51a with a layout that is in accordance with the floor plan. In FIG. 5, overly narrow regions that are empty are formed between the macro cells M6 and the macro cell M1 and between the macro cell M1 and the macro cell M2. To prevent standard cells from being laid out in these empty regions, the CPU 12 sets the empty regions as prohibitions regions K1 and K2, as shown in FIG. 6. The setting of the prohibition regions K1 and K2 decreases the standard cell region.

Figure 7:
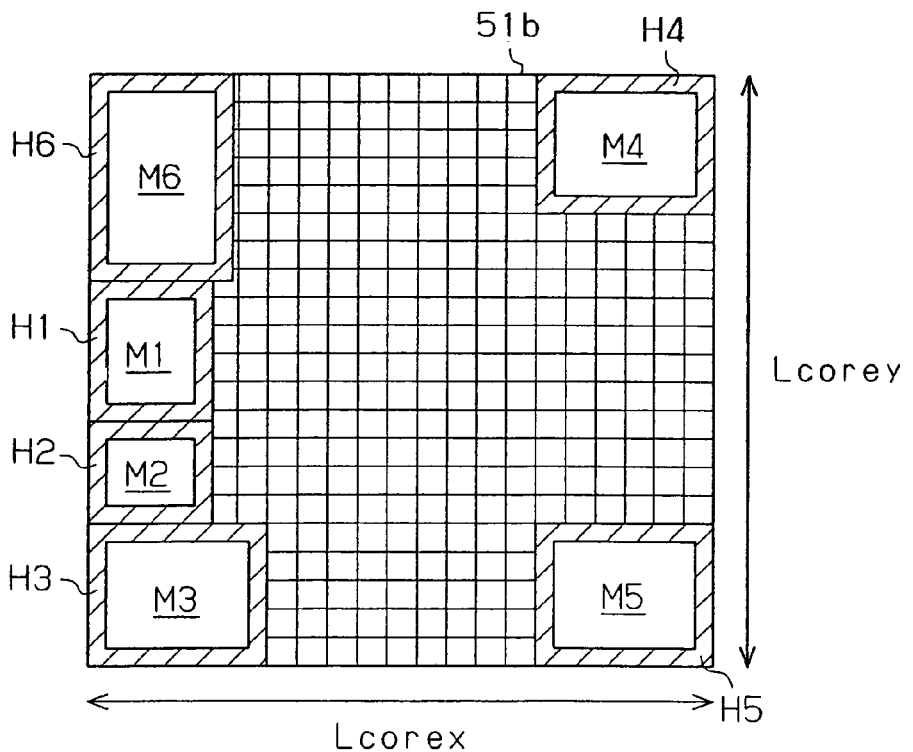
FIG. 7 is a schematic diagram showing a corrected core region.

Then, in step S28, the CPU 12 calculates the dead space area Sd0 and the dead space percentage Rd0. In the layout shown in FIG. 6, the dead space percentage Rd0 exceeds the reference value Rth. Thus, referring to FIG. 7, the CPU 12 moves the macro cell M1 and rotates and changes the orientation of the macro cell M6 to generate a core region 51b with a corrected floor plan. In the core region 51b of FIG. 7, the setting of prohibition regions is unnecessary. This enlarges the standard cell region compared with the layout of FIG. 6. Due to the enlargement of the standard cell region, in the layout of FIG. 7, standard cells may be laid out at optimal positions with respect to wiring length and timing closure even though the area of the core region 51b is the same as that of the core region 51a shown in FIG. 5. Further, the enlargement of the standard cell region facilitates the layout of standard cells and simplifies timing adjustment. This improves the timing closure. Thus, smaller chips may be developed within a short period of time.

The preferred embodiment has the advantages described below.

(1) The CPU 12 sets auxiliary layout regions H1 to H6 for the macro cells M1 to M6, calculates the area of the maximum standard cell region 52 by excluding the macro cells M1 to M6 and the auxiliary layout regions H1 to H6 from the core region 51, calculates the area of the actual standard cell region from the layout data of the macro cells M1 to M6, and calculates the dead space percentage subsequent to the layout of the macro cells M1 to M6 based on the maximum standard cell region area and the actual standard cell region area. Then, the CPU 12 determines whether or not to change the layout of the macro cells M1 to M6 based on the dead space percentage. In this manner, the CPU 12 checks the appropriateness of the floor plan when laying out the macro cells M1 to M6 to correct the floor plan before laying out the standard cells. This shortens the design loop that takes into consideration the size of the macro cells M1 to M6 and reduces design processes that must be redone. In comparison to the prior art in which the floor plan is changed after laying out the standard cells, the floor plan is determined within a shorter period. Further, by comparing the dead space percentage and the reference value and changing the layout of the macro cells so that the dead space percentage is less than or equal to the reference value, the LSI layout may be designed without enlarging the core region.

(2) The overly narrow regions formed between the macro cells M1, M2, and M6 laid out in accordance with the floor plan are set as layout prohibition regions K1 and K2, in which standard cells are not automatically laid out. The area of the actual standard cell region is calculated based on the total area of the macro cells M1 to M6, the auxiliary layout regions H1 to H6, and the layout prohibition regions K1 and K2. At this point of time, the layout prohibition regions K1 and K2 are dead spaces. Thus, the CPU 12 changes the layout of the macro cells M1 to M6 to decrease the dead space percentage and increase the area of the actual standard cell region. This facilitates the layout of the standard cells and enables the standard cells to be appropriately laid out.

(3) The CPU 12 determines the layout of the macro cells M1 to M6 so as to minimize the congestion of the signal wires and/or satisfy the timing conditions. This generates layout data having satisfactory routability and timing closure.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A method for generating layout data with a computer to lay out a plurality of macro cells in a core region of a semiconductor device, the method comprising:

determining auxiliary layout regions respectively corresponding to the macro cells;

storing information of the auxiliary layout regions in a memory;

calculating the area of a maximum standard cell region by subtracting the area of the macro cells and the area of the auxiliary layout regions from the area of the core region;

storing the area of the maximum standard cell region in the memory;

calculating the area of an actual standard cell region in which layout of standard cells is enabled in the core region in accordance with a floor plan result in which the macro cells are laid out;

storing the area of the standard cell region in the memory;

reading the area of the maximum standard cell region and the area of the actual standard cell region from the memory;

calculating a dead space percentage of the floor plan from the area of the maximum standard cell region and the area of the actual standard cell region;

comparing the dead space percentage with a reference value; and changing the layout of the macro cells corresponding to the floor plan based on the result of said comparing with the computer so that the dead space percentage becomes less than or equal to the reference value.

2. The method according to claim 1, wherein said calculating the area of an actual standard cell region includes:

setting an overly narrow region, defined between the macro cells that are laid out in accordance with the floor plan, as a layout prohibition region in which the layout of the standard cells is prohibited; and calculating the actual standard cell region based on the areas of the macro cells, the auxiliary layout regions, the layout prohibition region, and the core region.

3. The method according to claim 1, wherein said calculating a dead space percentage includes:

calculating a dead space area based on the areas of the maximum standard cell region and the actual standard cell region; and calculating the dead space percentage based on the dead space area and the area of the maximum standard cell region.

4. The method according to claim 1, further comprising:

determining the locations of the macro cells on the core region so as to satisfy at least one of a timing requirement and a congestion requirement for signal wires in the core region.

5. The method according to claim 1, wherein:

said determining auxiliary layout regions includes generating a plurality of margin-added macro cells by adding the auxiliary layout regions respectively to the macro cells;

said storing information of the auxiliary layout regions includes storing information of the margin-added macro cells in the memory;

said calculating the area of a maximum standard cell region includes excluding the area of the margin-added macro cells from the area of the core region;

said correcting the layout of the macro cells includes moving at least one of the margin-added macro cells so that the dead space percentage becomes less than or equal to the reference value.

6. The method according to claim 5, wherein the addition of the auxiliary layout regions includes adding the auxiliary layout regions to all of the macro cells so as to surround each macro cell with the corresponding auxiliary layout region.

7. The method according to claim 5, wherein each of the macro cells includes at least two sides, and the addition of the auxiliary layout regions includes adding along the at least two sides of each macro cell the corresponding auxiliary wiring region.

8. The method according to claim 5, wherein said moving the at least one of the margin-added macro cells includes changing the location of the at least one of the margin-added macro cells and rotating the at least one of the margin-added macro cells to change the orientation of the at least one of the margin-added macro cells.

9. The method according to claim 5, wherein said calculating the area of a maximum standard cell region includes moving all of the margin-added macro cells to a corner of the core region so that a single vacant remaining region is formed in the core region and calculating the area of the single vacant remaining region as the area of the maximum standard cell region.

10. The method according to claim 1, wherein the auxiliary layout regions are regions in which wires to be connected to the corresponding macro cell are routed.

11. An apparatus for generating layout data to lay out a plurality of macro cells in a core region of a semiconductor device, the apparatus comprising:

a memory;

an auxiliary layout region calculation circuit for determining auxiliary layout regions respectively corresponding to the macro cells, and for storing information of the auxiliary layout regions in the memory;

a maximum standard cell calculation circuit for calculating the area of a maximum standard cell region by subtracting the area of the macro cells and the area of the auxiliary layout regions from the area of the core region, and for storing the area of the maximum standard cell region in the memory;

an actual standard cell calculation circuit for calculating the area of an actual standard cell region in which layout of standard cells is enabled in the core region in accordance with a floor plan result in which the macro cells are laid out, and for storing the area of the standard cell region in the memory;

a dead space calculation circuit for reading the area of the maximum standard cell region and the area of the actual standard cell region from the memory to calculate a dead space percentage of the floor plan from the area of the maximum standard cell region and the area of the actual standard cell region;

a dead space determination circuit for comparing the dead space percentage with a reference value to determine whether or not the layout of the macro cells must be changed; and a floor plan generation circuit for generating a floor plan based on the determination result of the dead space determination circuit by changing the layout of the macro cells so that the dead space percentage becomes less than or equal to the reference value.

12. The apparatus according to claim 11, wherein:

the floor plan generation circuit sets an overly narrow region, defined between the macro cells that are laid out in accordance with the floor plan, as a layout prohibition region in which the layout of the standard cells is prohibited; and the standard cell region calculation circuit calculates the actual standard cell region based on the areas of the macro cells, the auxiliary layout regions, the layout prohibition region, and the core region.

13. The apparatus according to claim 11, wherein the dead space percentage calculation circuit:

calculates a dead space area based on the areas of the maximum standard cell region and the actual standard cell region; and calculates the dead space percentage based on the dead space area and the area of the maximum standard cell region.

14. The apparatus according to claim 11, wherein the floor plan generation circuit determines the locations of the macro cells on the core region so as to satisfy at least one of a timing requirement and a congestion requirement of signal wires in the core region.

15. The apparatus according to claim 11, wherein:

the auxiliary layout region calculation circuit adds the auxiliary layout regions respectively to the macro cells to generate a plurality of margin-added macro cells, and stores information of the margin-added macro cells in the memory;

the maximum standard cell calculation circuit subtracts the area of the margin-added macro cells from the area of the core region to calculate the area of the maximum standard cell region;

the floor plan generation circuit generates a corrected floor plan based on the determination result of the dead space determination circuit by moving at least one of the margin-added macro cells so that the dead space percentage becomes less than or equal to the reference value.

16. The apparatus according to claim 15, wherein the auxiliary layout region calculation circuit adds the auxiliary layout regions to all of the macro cells so as to surround each macro cell with the corresponding auxiliary layout region.

17. The apparatus according to claim 15, wherein each of the macro cells includes at least two sides, and the auxiliary layout region calculation circuit adds along the at least two sides of each macro cell the corresponding auxiliary wiring region.

18. The apparatus according to claim 15, wherein the floor plan generation circuit changes the location of the at least one of the margin-added macro cells and rotates the at least one of the margin-added macro cells to change the orientation of the at least one of the margin-added macro cells.

19. The apparatus according to claim 15, wherein the maximum standard cell calculation circuit moves all of the margin-added macro cells to a corner of the core region so that a single vacant remaining region is formed in the core region and calculates the area of the single vacant remaining region as the area of the maximum standard cell region.

20. The apparatus according to claim 11, wherein the auxiliary layout regions are regions in which wires to be connected to the corresponding macro cell are routed.

* * * * *